United States Patent
Steidl et al.

[11] Patent Number: 5,814,892
[45] Date of Patent: Sep. 29, 1998

[54] SEMICONDUCTOR DIE WITH STAGGERED BOND PADS

[75] Inventors: Michael J. Steidl, Fremont; Sanjay Dandia, San Jose, both of Calif.

[73] Assignee: LSI Logic Corporation, Milpitas, Calif.

[21] Appl. No.: 660,490

[22] Filed: Jun. 7, 1996

[51] Int. Cl.$^6$ ............................. H01L 23/48; H01L 23/52
[52] U.S. Cl. .......................... 257/784; 257/786; 257/674; 438/617
[58] Field of Search ................................. 257/784, 786, 257/668, 674, 676; 438/617

[56] References Cited

U.S. PATENT DOCUMENTS

| | | | |
|---|---|---|---|
| 4,618,879 | 10/1986 | Mizukoshi et al. | 257/784 |
| 4,881,029 | 11/1989 | Kawamura | 324/158 |
| 5,012,213 | 4/1991 | Tsai | 257/784 |
| 5,091,772 | 2/1992 | Kohara et al. | 257/784 |
| 5,177,668 | 1/1993 | Lederer et al. | 257/786 |
| 5,233,221 | 8/1993 | Bregman et al. | 257/786 |
| 5,296,744 | 3/1994 | Liang et al. | 257/784 |
| 5,455,460 | 10/1995 | Hongo et al. | 257/786 |
| 5,497,031 | 3/1996 | Kozono | 257/784 |
| 5,510,654 | 4/1996 | Nishino et al. | 257/786 |
| 5,569,964 | 10/1996 | Ikebe | 257/786 |

*Primary Examiner*—David Ostrowski
*Attorney, Agent, or Firm*—Luedeka, Neely & Graham, P.C.

[57] ABSTRACT

Improved manufacturability, yield, and reliability are achieved during wirebonding of a semiconductor die of reduced size by employing two rows of staggered conductive connectors, or bond pads, for wirebonding the die to a semiconductor package. An outer row of conductive connectors is positioned closer to the edge of the die than an inner row of conductive connectors and includes a greater number of connectors than the inner row. The die can be wirebonded to a package substrate having either a single row of bondfingers or multiple rows of bondfingers. In one embodiment, bond wires attaching the inner row of conductive pad connectors to the package substrate have a greater loop height than bond wires attaching the outer row of conductive pad connectors to the package substrate.

13 Claims, 11 Drawing Sheets

SEMICONDUCTOR DIE WITH STAGGERED BOND PADS

TECHNICAL FIELD

The present invention relates to a method and apparatus improving manufacturability, yield, and reliability of semiconductor and of semiconductor packages by positioning bond pads and bondfingers in staggered patterns.

BACKGROUND

In today's microelectronic environment, chip designers seek to reduce both device and feature size while maintaining or improving operability and manufacturability. Reducing the size of features, such as I/O buffers on semiconductor devices, presents difficulties in proportionately reducing device or die size. Smaller dies generally have less area available for wirebonding the device to the package substrate. In many cases, die size is limited by wirebonding requirements of bond pad quantity and bond pad pitch. As die size decreases with the same number of pads, the likelihood that the wirebonding process may result in increased yield loss due to electrical shorts. Thus, smaller die sizes place a premium on manufacturing tolerances.

Peripheral pad pitch on devices has been reduced to approximately 3.5 mils to match I/O buffer pitch, but further reduction is constrained by limitations of the wirebond process. To provide further reduction of die size, some devices have employed a staggered pad pattern as shown in FIG. 1. Pad pitch reduction to 2.9 mils has been achieved by utilizing the stagger pattern of FIG. 1; however, space limitations and manufacturing tolerance requirements cause manufacturing yields to suffer at this level of pad pitch reduction.

As FIG. 1 illustrates, the standard for staggered pad designs has been to provide two rows of alternating pads, shown generally at 10 and 11, on the die 12. The two rows 10, 11 contain an equal, or substantially equal, number of pads. The alternating pads are connected by wires 13 to a single row of bondfingers 14 on the package substrate 16. This type of staggered pad pattern presents two major limitations. First, space constraints limit the ability to bond the wires 13 to the package substrate 16 because as die size shrinks, there is an increasing likelihood that wires 13 and/or bond pads may cross or short. This concern results in lower manufacturing yields and reduced reliability as die size is reduced. Second, space constraints limit the ability to route wide metal connections on the die 12 to avoid electromigration problems that would otherwise require additional Vss2 (ground ring) and Vdd2 (power ring) connections. A single bondfinger row with the same design rules does not capture the smallest die.

To illustrate these limitations of the prior art, consider the geometries shown in FIG. 2, which illustrates a typical prior art arrangement of I/O buffers 27, metal traces 60, 61, 62, 63, and 64, and conductive pad connectors 25a–e. FIG. 2 illustrates the geometries and dimensions presently achievable by staggering the conductive pad connectors 25a–e onto which the wirebonds (indicated generally at 26a and 26b) are bonded to accommodate I/O buffers 27 having a buffer pitch 29 of 2.9 mils (74.8$\mu$). Conductive pad connectors in each row are separated by a pad gap 65 of 63.75$\mu$ so that each row possesses the same number of connectors. For example, the pad gap 65 between conductive pad connectors 25a and 25b is 63.75$\mu$, and the pad gap 65 between conductive pad connectors 25d and 25e is 63.75$\mu$. Metal traces 60, 62 and 64 connecting the outer row of conductive pad connectors 25a–c to the buffer 27 are each routed between two conductive pad connectors in the inner row of connectors 25d, 25e with a trace-to-connector gap 31 (gap between outer row metal traces and inner row conductive pad connectors) of 6.87$\mu$.

Spacing between conductive pad connectors 25a–25e and metal traces 60–64 leave little room for error for attachment of bondwires 26a, 26b during manufacturing. Bondwire 26a illustrates a wire that has been correctly positioned during manufacturing. The wire 26a does not touch or create electrical conductivity with any feature except conductive pad connector 25d. In contrast, consider the positioning of bondwire 26b which is slightly out of alignment with its conductive pad connector 25e. More precisely, bondwire 26b is shown mispositioned by only 7$\mu$ so that, instead of making electrical contact only with its conductive pad connector 25e, bondwire 26b has shorted with metal trace 62. Additionally, misalignment of bondwire 26b in the direction of metal trace 62 increases the likelihood that the bondwire interconnecting wire 26b with the package will short with the bondwire connected at conductive pad connector 25b. Therefore, manufacturing yields and reliability suffer with the prior art device of FIG. 2.

The widths of traces 60–64 are each 50$\mu$, which is generally recognized as a minimum width for prevention of unacceptable electromigration levels. As can be seen from the arrangement of FIG. 2, the ability of the prior art to provide for a denser arrangement of conductive pad connectors 25a–25e is limited by trace width requirements. Narrowing the trace widths is not practicable because doing so increases electromigration problems beyond an acceptable level. Positioning the conductive pad conductors 25a–25e closer together is not a viable solution either since this would decrease the trace-to-connector gap 31 even further, resulting in even lower production yields and reliability.

FIG. 3 illustrates what happens when one attempts to reduce buffer pitch 41 to 2.5 mils (62.3$\mu$) while keeping trace width at 50$\mu$. The result is a trace-to-connector gap 43 of –0.4$\mu$; i.e., the metal traces actually overlap and short the conductive pad connectors. As FIG. 3 illustrates, the limitations of presently known pad staggering techniques to accommodate ever shrinking buffer sizes are exceeded for a 2.5 mil buffer pitch.

Therefore, what is needed is an apparatus and method for providing more effective utilization of the available area on semiconductor devices, including the die and package, in order to provide maximum clearance between wires, pads, and metal traces as die feature sizes are reduced, which increases manufacturability and yields.

SUMMARY

In accordance with a preferred embodiment of the invention, a semiconductor device is provided. The device includes a semiconductor die having a first surface and a first edge. Two rows of conductive connectors, or bond pads, are disposed on the die. An outer row of conductive connectors is positioned substantially parallel to the first edge at a first distance from the first edge. An inner row of conductive connectors is positioned next to the outer row at a second distance from the first edge that is greater than the first distance. The outer row, which is closest to the edge of the die, has more connectors than the inner row. Finally, the device includes a plurality of conducting traces that are adjacent to one another, disposed between two connectors of the inner row, and connected to conductive connectors in the outer row.

In one embodiment, the outer row of conductive connectors contains twice as many connectors as the inner row. Other embodiments provide for three and four times as many connectors in the outer row as are positioned in the inner row.

The device may also include a package substrate having at least one row of bondfingers, and wires that electrically connect the conductive connectors to the bondfingers. A second row of bondfingers, with wires connecting the bondfingers in the second row to one row of the conductive connectors, can be added to the package substrate. To ensure proper wire clearances, wires interconnecting one row of the bondfingers to one row of the conductive connectors employ a different wire loop height than wires that interconnect the other rows of bondfingers and conductive connectors.

Finally, the invention provides a package for being electrically connected to a semiconductor die. The package includes a substrate having more than one row of bondfingers positioned in a common plane for wirebonding to the die.

BRIEF DESCRIPTION OF PREFERRED EMBODIMENTS

The preferred embodiments of the invention will now be described in further detail with reference to the drawings wherein like reference characters designate like or similar elements throughout the several drawings as follows.

DETAILED DESCRIPTION OF PREFERRED EMBODIMENTS

Figure 4:
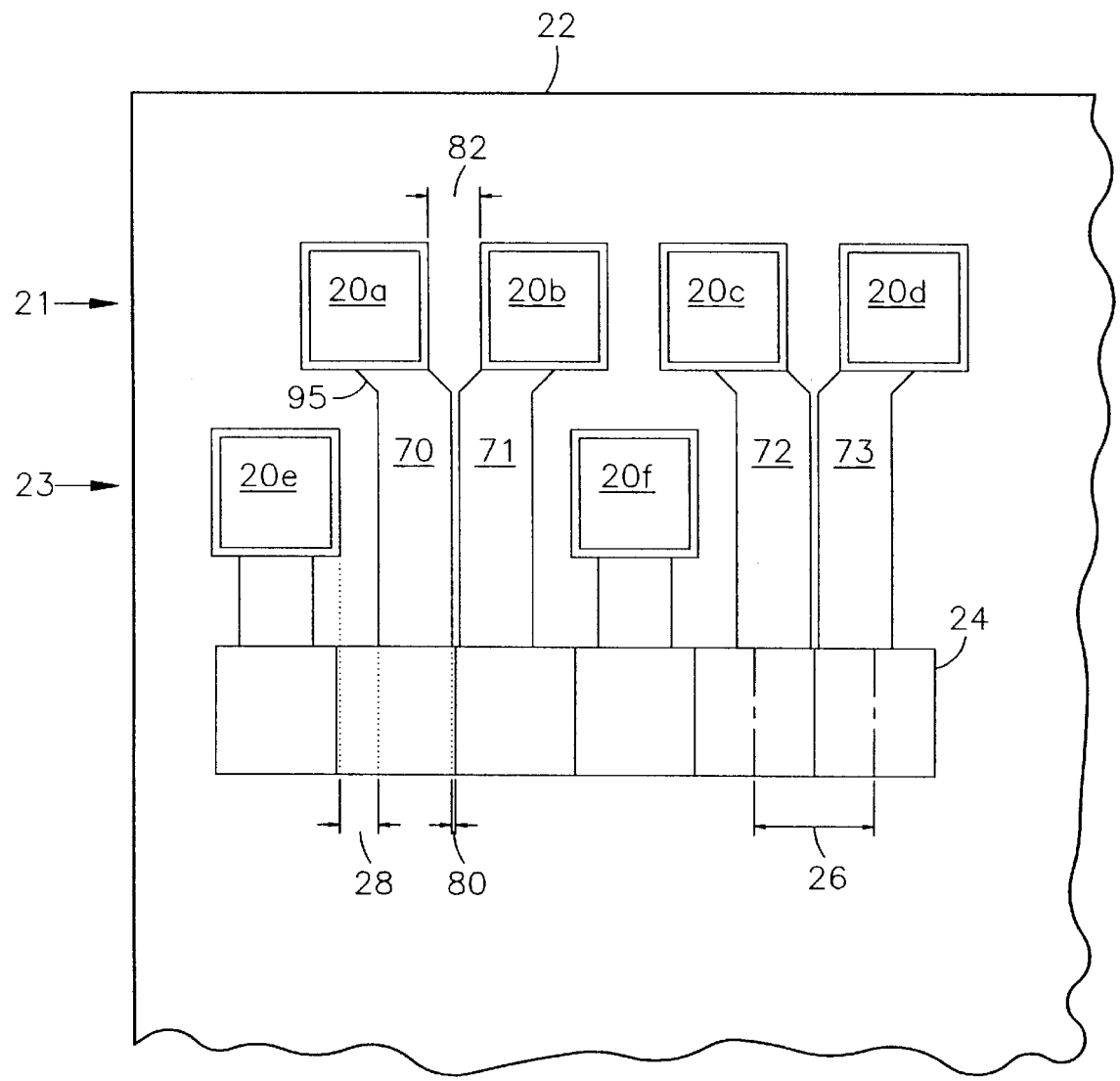
FIG. 4 is a top sectional view of a die employing a two-to-one embodiment of the stagger pattern of the present invention.

To improve manufacturability, yield, and reliability as semiconductor die sizes are reduced, the present invention provides for the use of bond pads arranged in a staggered pattern as shown in FIG. 4. As FIG. 4 illustrates, bondwires (not shown), which are attached to bond pads, or conductive pad connectors 20a–f, are geometrically arranged on a die 22 in two rows. The row (outer row) closest to the edge of the die 22, which includes connectors 20a–d and is generally designated at 21, contains a greater number of pads than does the row (inner row) closest to the center of the die 22, which includes connectors 20e, 20f and is generally designated at 23. In a preferred embodiment, outer row 21 contains twice as many conductive connectors as inner row 23 so that a two-to-one relationship exists between the two rows (e.g., there are two pads in the outer row 21 for every one pad in the inner row 23). Outer row traces 70, 71, 72, and 73 are each routed between an inner row connector and an outer row trace. For example, outer row trace 70 is routed between inner row connector 20e and outer row trace 71.

With continued reference to FIG. 4, the outer row traces 70–73 are arranged in pairs 70, 71 and 72, 74, where each pair of outer row traces is routed between two inner row connectors 20e, 20f. At the point of connection 95 to the outer row connectors 20a–d, each outer row trace 70–73 is angled to take advantage of the available pad gap 82 between each of the upper row pads 20a–d so that the trace gap 80 between each pair of upper row traces 70, 71 and 72, 73 is relatively small, preferably $1\mu$. I/O buffer pitch 26, defined as the center-to-center distance between each of the I/O buffers in the buffer row 24, is 2.9 mils ($74.8\mu$) and trace width is $50.0\mu$.

Given a constant conductive pad connector size and a constant trace width, the stagger pattern of FIG. 4 provides a larger trace-to-connector gap 28 than can be provided by the prior art. This larger gap 28 enables greater tolerance of bond pad misalignment. In other words, a greater amount of error during manufacturing in the form of misplacement of bondwires can be tolerated with the stagger pattern of FIG. 4 because there is more room for error. The result is better manufacturability, improved yields, and increased reliability. Electromigration problems are also reduced by keeping metal traces 70–73 wider.

Figure 1:
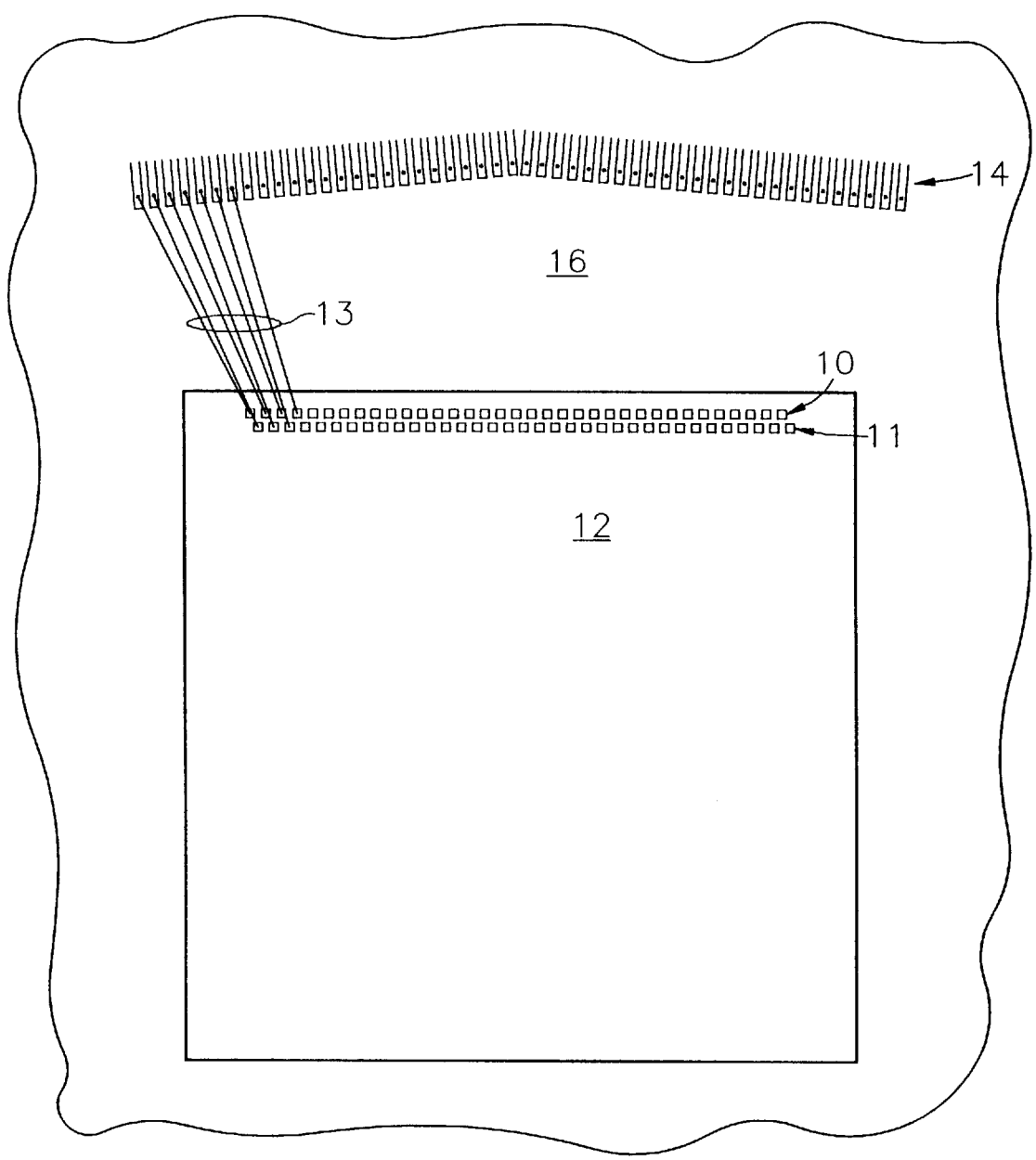
FIG. 1 is a top sectional view of a prior art semiconductor device having two rows of staggered pads on the die for wirebonding the die to a single row of bondfingers on the package substrate.
Figure 2:
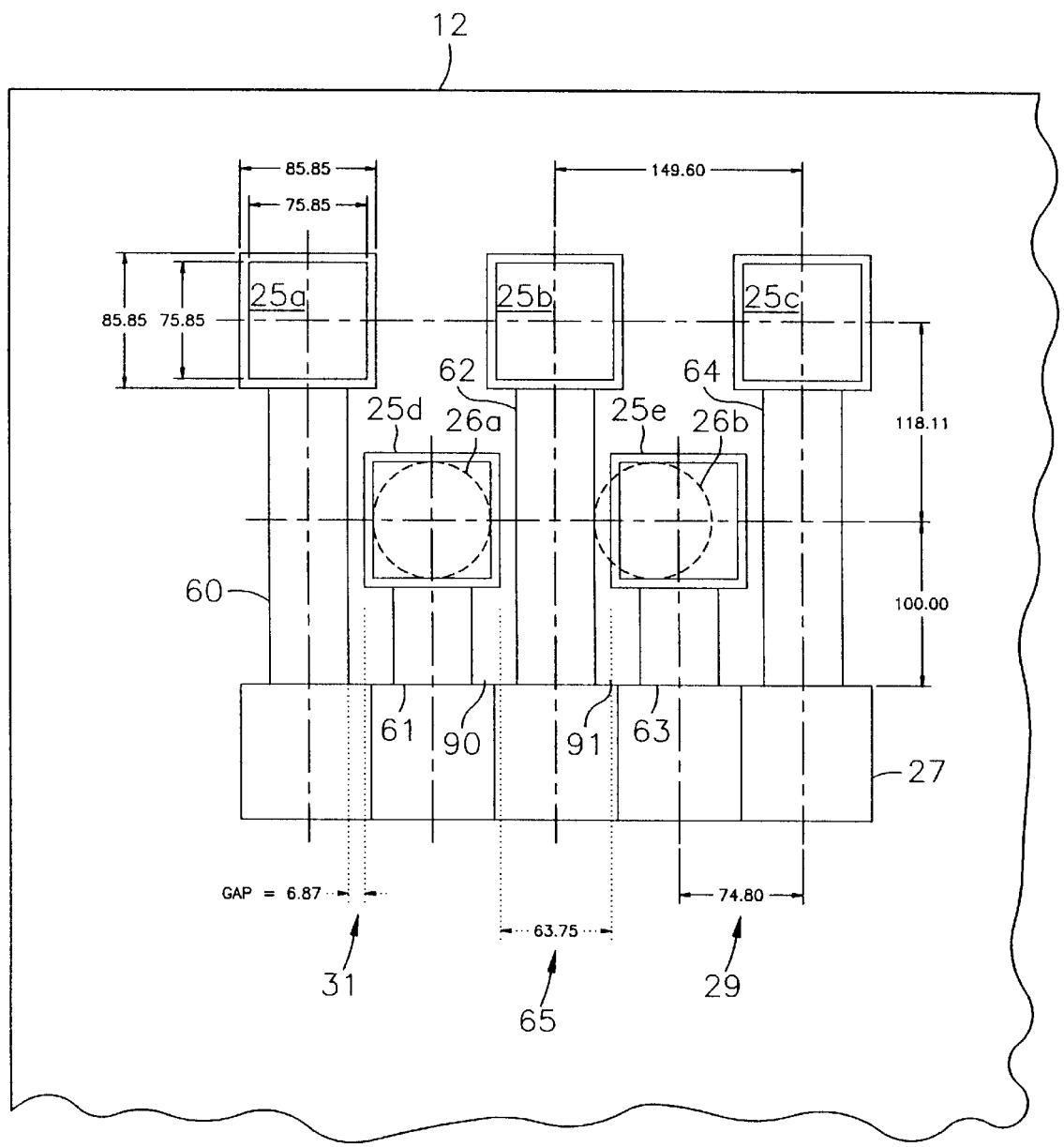
FIG. 2 is a top sectional view of a prior art die having an I/O buffer pitch of 2.9 mils, and showing dimensions and clearances achievable with the stagger pattern shown in FIG. 1.
Figure 5:
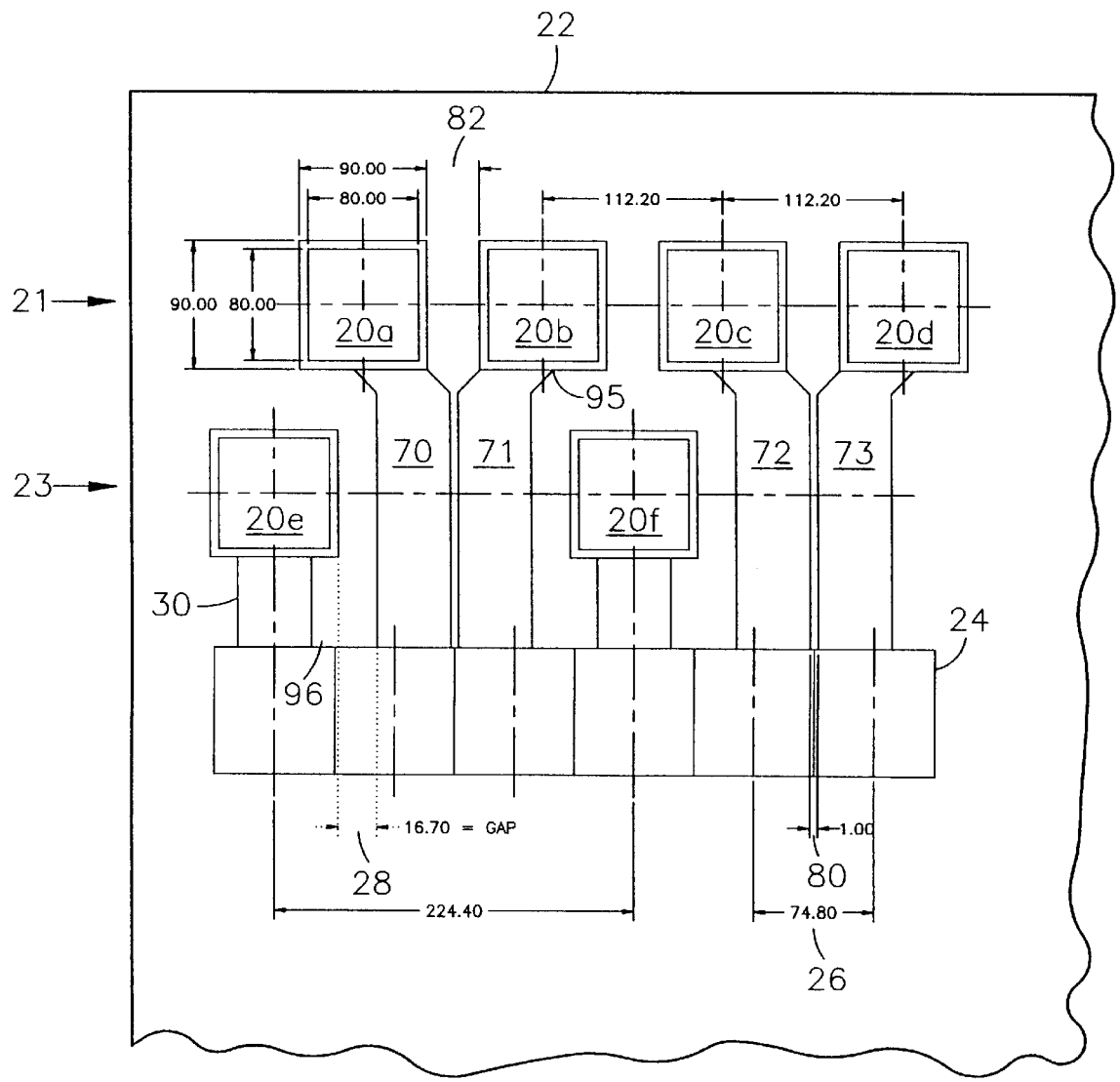
FIG. 5 is a top sectional view of a die employing a two-to-one bond pad stagger pattern of the present invention, including dimensions and clearances for an I/O buffer pitch of 2.9 mils.

FIG. 5 adds some typical dimensions to the stagger pad pattern of FIG. 4. It should be noted that dimensions shown in FIG. 5, as well as FIGS. 6 through 12, are exemplary only and are not a limitation of the invention. For a pad pitch 26 of 2.9 mils and a conductive pad connector size of $91.0\mu \times 90.0\mu$, the trace-to-connector gap 28 is $16.7\mu$. This gap 28 is significantly larger than the gap 31 provided by the prior art stagger pattern of FIG. 2, despite the fact that the conductive pad connector dimensions of FIG. 2 are smaller ($85.85\mu \times 85.85\mu$). The larger conductive pad connectors 20a–20f enabled by the FIG. 5 embodiment also help to prevent misalignment of bond pads which further improves manufacturability, yield, and reliability.

Figure 3:
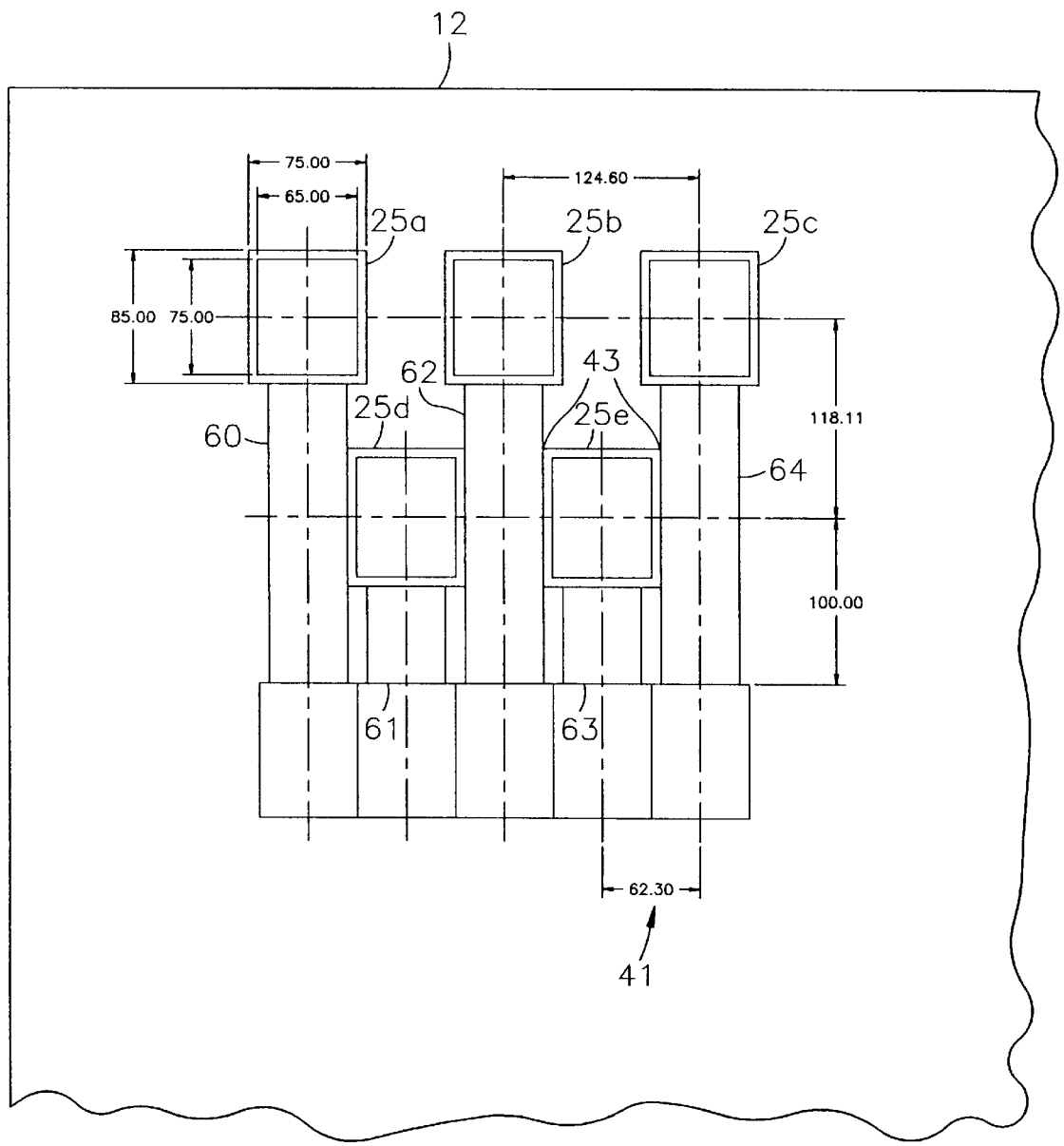
FIG. 3 is a top sectional view of a prior art die having an I/O buffer pitch of 2.5 mils, and showing dimensions and clearances achievable with the FIG. 1 stagger pattern.
Figure 6:
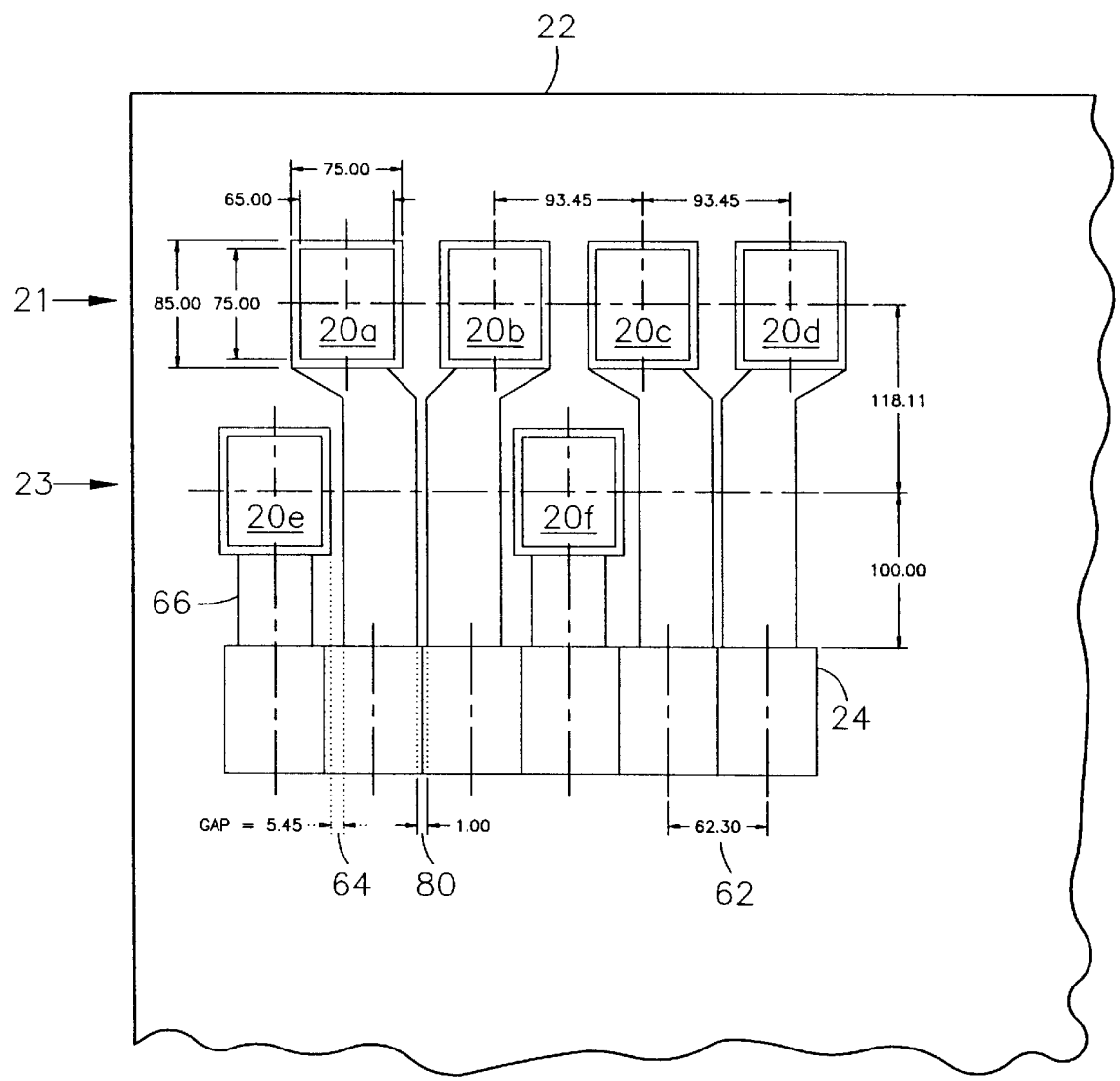
FIG. 6 is a top sectional view of a die employing a two-to-one bond pad stagger pattern, including dimensions and clearances for an I/O buffer pitch of 2.5 mils.

In another embodiment shown in FIG. 6, conductive pad connectors 60a–f are dimensioned and spaced to accommodate a buffer pitch 62 equal to 2.5 mils ($62.3\mu$). The dimensions of the conductive pad connectors 20a–20f are $75.0\mu \times 85.0\mu$ and the trace width is $50.0\mu$. These are the same buffer pitch, conductive pad connector, and trace width dimensions as illustrated in the prior art embodiment of FIG. 3. However, unlike the FIG. 3 device which provides a negative trace-to-connector gap 43, the device of FIG. 6 provides a positive trace-to-connector gap 64 of 5.45$\mu$. Thus, the stagger pattern of the present invention enables reduction of die size beyond that which can be achieved with the prior art.

Figure 7:
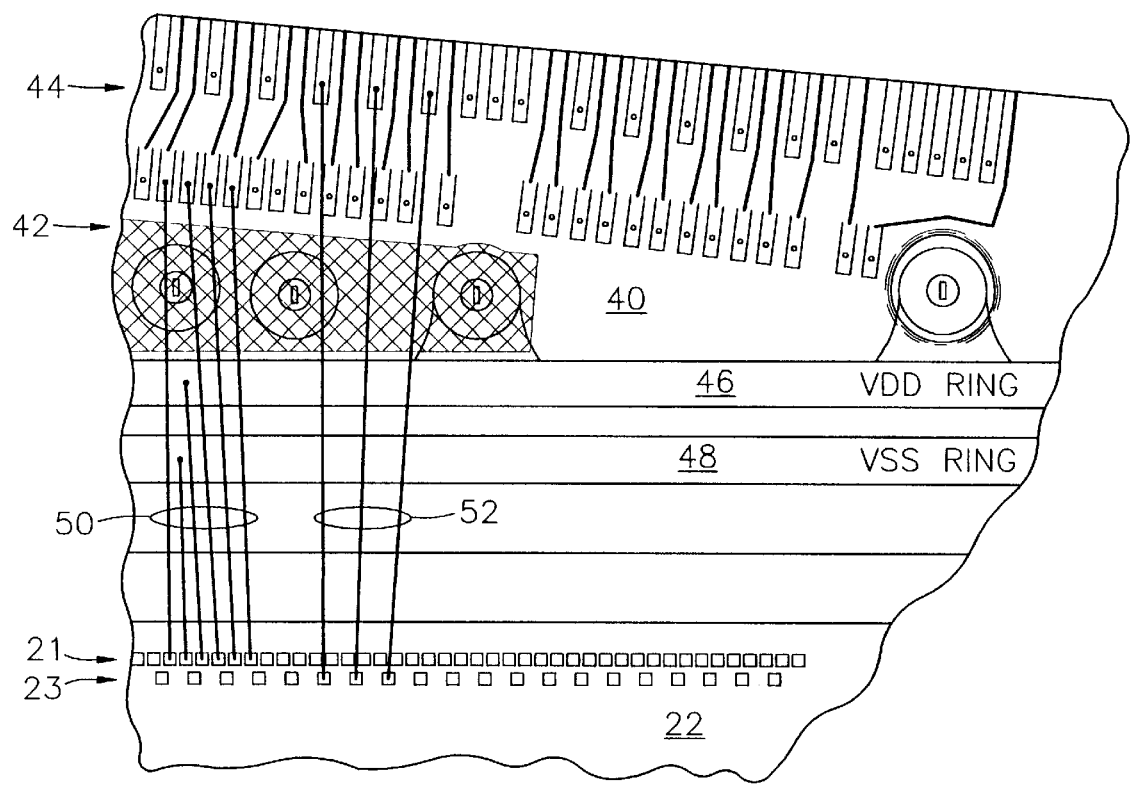
FIG. 7 is a top sectional view of a semiconductor device showing wire connections between a die having a two-to-one bond pad stagger pattern and a package substrate having two rows of bondfingers.

To wirebond the die 22 to the package substrate 40, two rows of bondfingers, an inner row 42 and an outer row 44, positioned in a common plane may be provided on the package substrate 40, as indicated in FIG. 7. In an alternate embodiment (not shown), a single row of bondfingers is provided. However, given the present state of wirebonding technology, this alternate embodiment is not preferred because bonding the same size die 22 to a single row of bondfingers requires a greater distance between the bondfingers and conductive pad connectors if using the same minimum width for bondfingers on the substrate. This results in the use of longer wires which exhibit greater inductance than the shorter wire lengths that can be used for bonding to a two bondfinger substrate. Longer wires also allow greater sweep and sagging which causes lower yield due to shorting.

With continued reference to FIGS. 5 and 7, conductive pad connectors 20$a$–$d$ in row 21 closest to the edge of the die 22 are wirebonded (as represented by wires 50) to the inner row of bondfingers 42 located on the package substrate 40 or the Vdd (power) ring 46 and Vss (ground) ring 48. Conductive pad connectors 20$e$, 20$f$ in row 23 closest to the center of the die 22 are wirebonded (as represented by wires 52) to the outer row of bondfingers 44 on the substrate 40. Since more conductive pad connectors 20$a$–$d$ are positioned in row 21 than in row 23, a correspondingly greater number of bondfingers are contained in row 42 than in row 44 of the package substrate 40.

Figure 8:
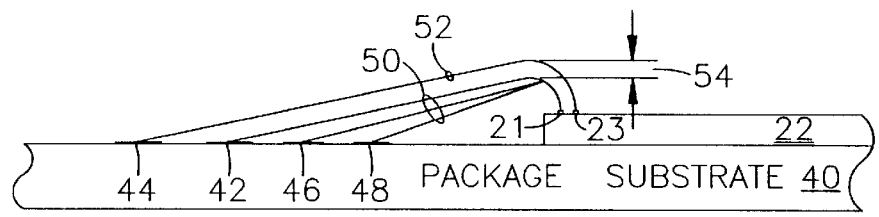
FIG. 8 is a side sectional view of the die and substrate of FIG. 7, showing the two differing wire loop heights used for bonding the die to the substrate.

As FIG. 8 illustrates, two different wire loop heights are used to bond the die 22 to the substrate 40, thereby further improving wire clearances to minimize the potential for having crossed or shorted wires. During the wirebonding process, outer bond pad row 21 is bonded to inner bondfinger row 42, power ring 46, and ground ring 48 using a first wire loop height. Inner bond pad row 23 is bonded to outer bondfinger row 44 using a second wire loop height that is greater than the first wire loop height. The difference between the first and second wire loop heights is indicated at 54. The use of two different wire loop heights improves manufacturability during the wirebonding process. This in turn improves manufacturability yield and reliability. The ASIC (application specific integrated circuit) designer is also provided with greater flexibility in assigning bond pads.

Referring again to FIGS. 5 and 7, it is advantageous to locate a greater number of bond pads in the row 21 closest to the edge of the die 22 since this enables more signals to be wirebonded to the inner row 42 of bondfingers on the substrate 40. This simplifies wirebonding the relatively longer wires for the remaining signals from bond pad row 23 on the die 22 to bondfinger row 44 on the substrate 40. The invention also provides for a greater number of short length wires having less inductance than wires of longer lengths, thereby improving electrical parasitics in a majority of the signals in the package.

Figure 9:
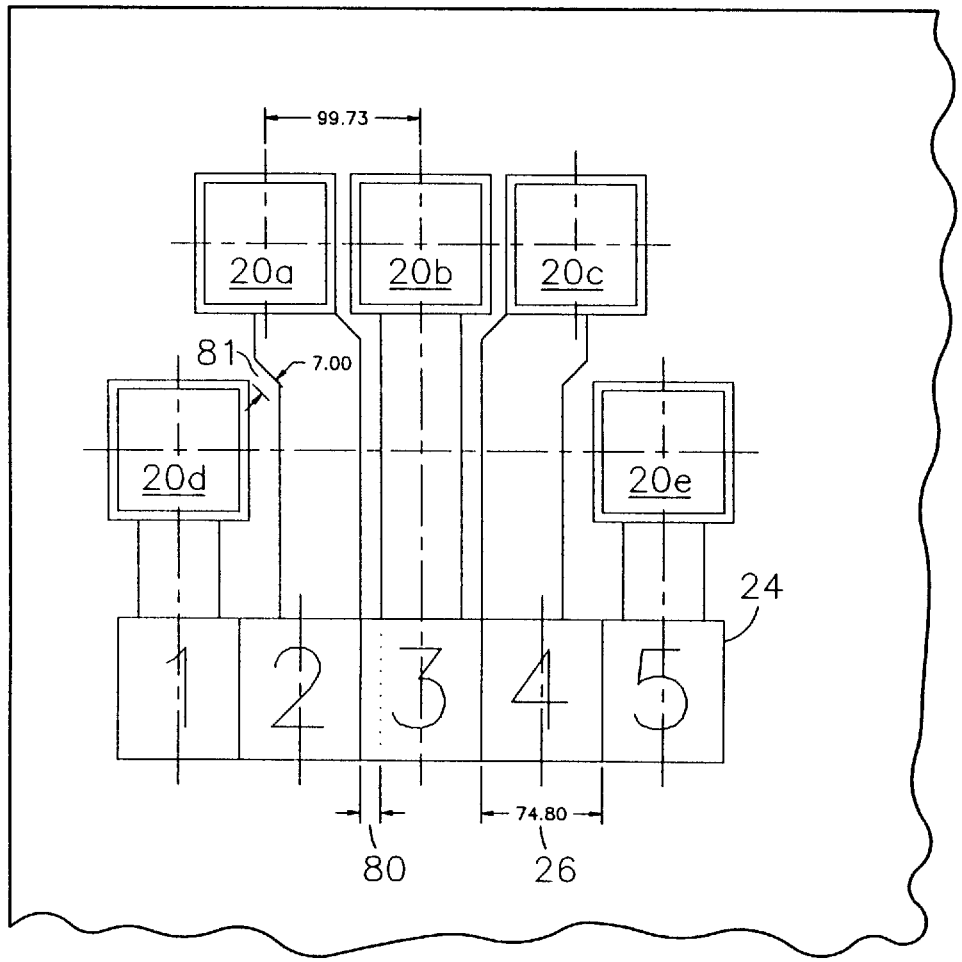
FIG. 9 is a top sectional view of a die employing a three-to-one bond pad stagger pattern, including dimensions and clearances for an I/O buffer pitch of 2.9 mils.
Figure 10:
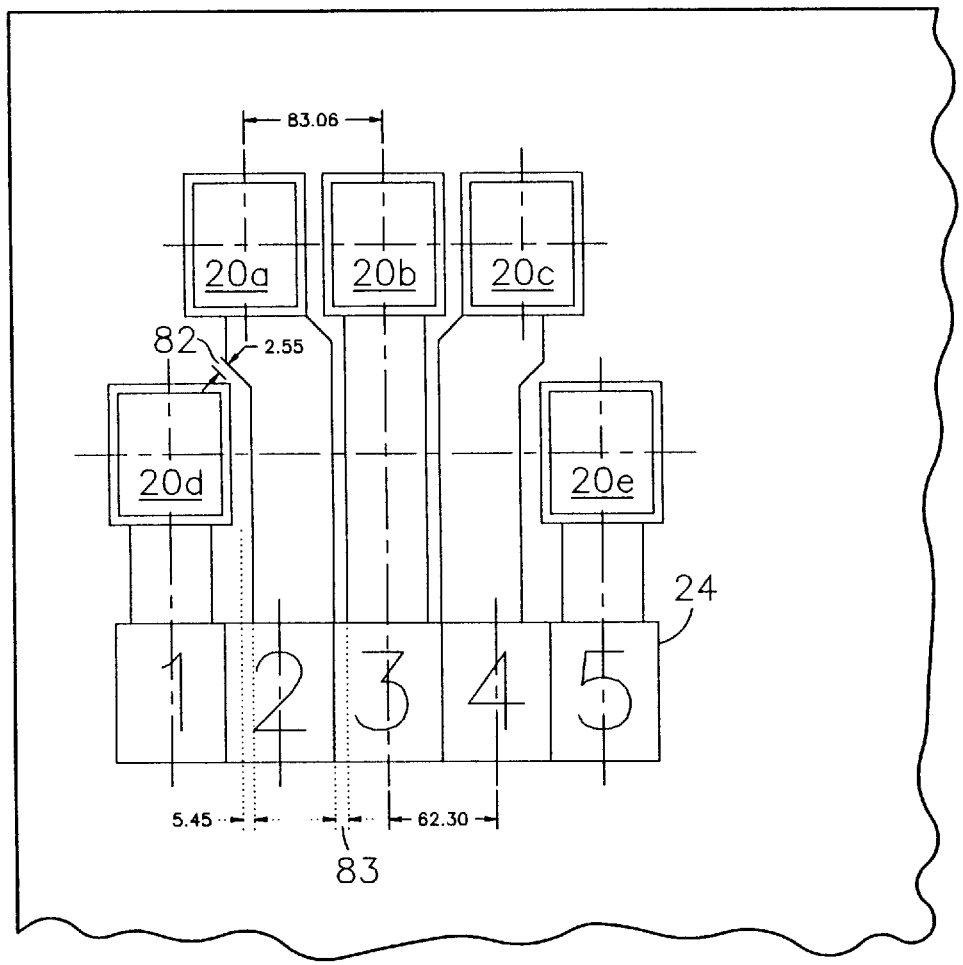
FIG. 10 is a top sectional view of a die employing a three-to-one bond pad stagger pattern, including dimensions and clearances for an I/O buffer pitch of 2.5 mils.
Figure 11:
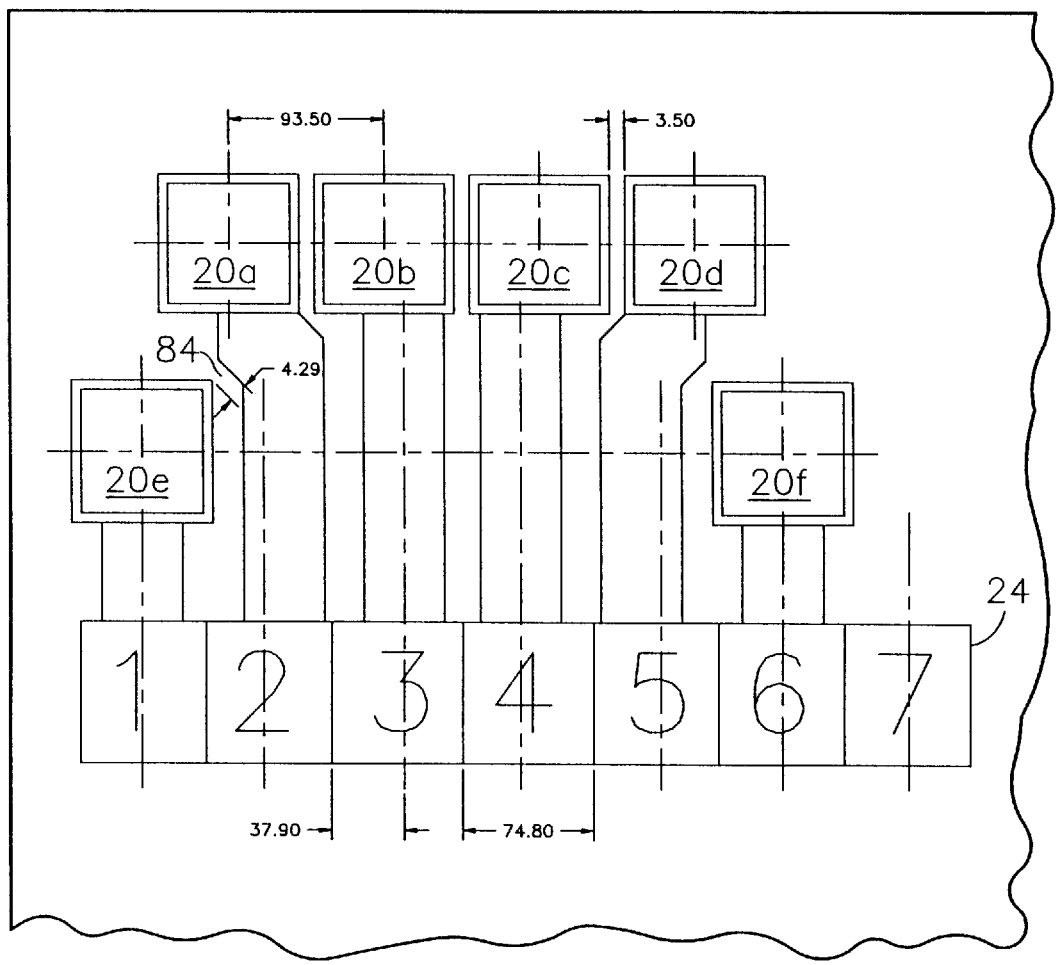
FIG. 11 is a top sectional view of a die employing a four-to-one bond pad stagger pattern, including dimensions and clearances for an I/O buffer pitch of 2.9 mils.
Figure 12:
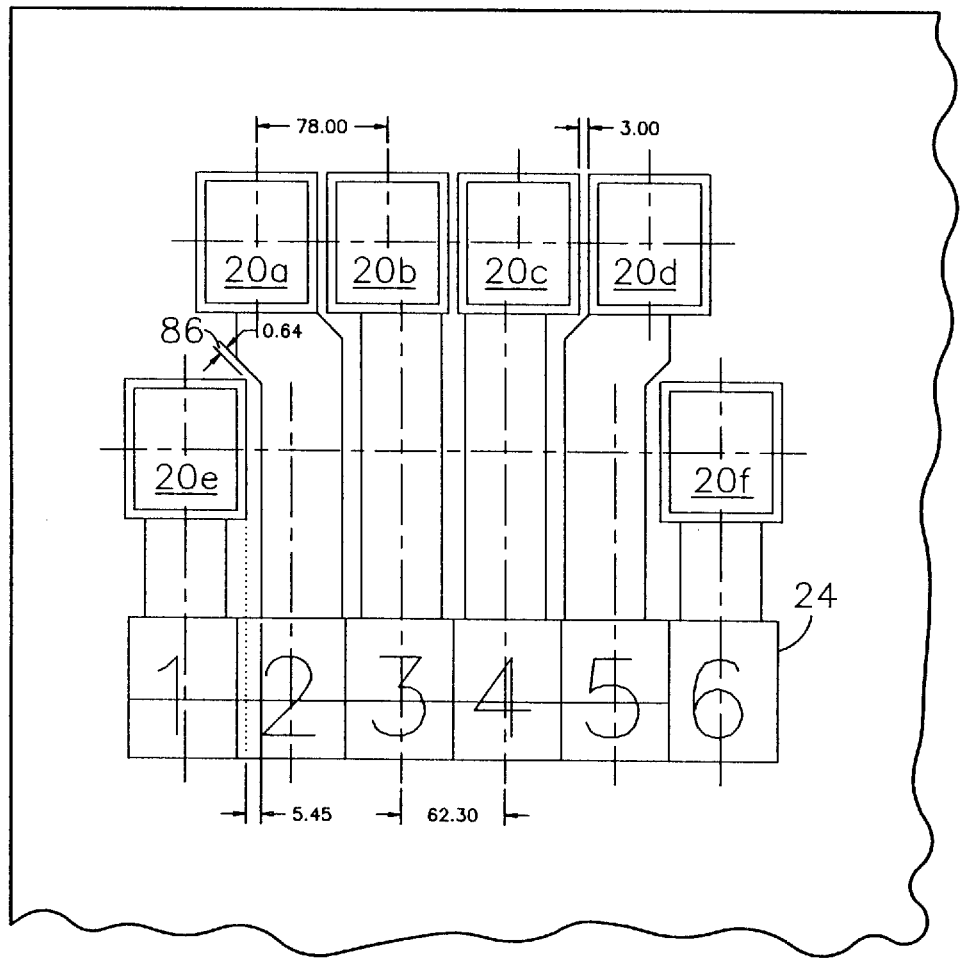
FIG. 12 is a top sectional view of a die employing a four-to-one bond pad stagger pattern, including dimensions and clearances for an I/O buffer pitch of 2.5 mils.

As the preferred embodiments of FIGS. 9–12 illustrate, the present invention is not limited to a two-to-one stagger pattern. FIGS. 9 and 10 illustrate three-to-one embodiments while FIGS. 11 and 12 illustrate four-to-one embodiments.

In the three-to-one configuration of FIG. 9, buffer pitch 26 is 2.9 mils, conductive pad connector dimensions are 90.0$\mu$×90.0$\mu$, and trace width is 50$\mu$. The resultant trace-to-connector gap 81 is 7.0$\mu$ where trace gap 80 is 1$\mu$. In FIG. 10, buffer pitch is 2.5 mils, conductive pad connector dimensions are 75.0$\mu$×85.0$\mu$, trace width is 50$\mu$, and trace gap 83 is 1$\mu$, resulting in a trace-to-connector gap 82 of 2.55$\mu$. FIG. 11 shows that in a four-to-one embodiment, a buffer pitch of 2.9 mils provides a trace-to-connector gap 84 of 4.29$\mu$, and the 2.5 mil buffer pitch of FIG. 12 provides a trace-to-connector gap of 0.64$\mu$.

The embodiments of FIGS. 9–12 exhibit even better electrical parasitic characteristics than the two-to-one embodiments previously discussed since a greater number of conductive pad connectors 20$a$–$f$ are included in the outer rows. These outer row conductive pad connectors 20$a$–$d$ will have shorter wires with reduced inductance. Thus, more signals in the package will have better electrical parasitics.

It is contemplated, and will be apparent to those skilled in the art from the foregoing specification, drawings, and examples that modifications and/or changes may be made in the embodiments of the invention. Accordingly, it is expressly intended that the foregoing are illustrative of preferred embodiments only, not limiting thereto, and that the true spirit and scope of the present invention be determined by reference to the appended claims.

What is claimed is:

1. A semiconductor device comprising:
 a semiconductor die having a first surface and a first edge;
 an outer row of conductive connectors disposed on said die substantially parallel to said first edge at a first distance from said first edge;
 an inner row of conductive connectors disposed on said die and positioned adjacent to said outer row at a second distance from said first edge that is greater than said first distance;
 said outer row having a greater number of connectors than said inner row;
 a plurality of conducting traces adjacent one another and separated one from the other by a third distance, said plurality of conducting traces disposed between and separated from connectors of the inner row by a fourth distance, each of said traces being connected to a unique one of said connectors in said outer row, and
 the conductive connectors of the inner and outer rows staggered such that adjacent conductive connectors of the inner row are separated by at least two of the plurality of conducting traces.

2. The device of claim 1, further comprising:
 a package substrate having at least one row of bondfingers; and
 a plurality of wires for electrically connecting said conductive connectors to said bondfingers.

3. The device of claim 1, further comprising:
 a package substrate including:
  an inner row of bondfingers positioned at a fifth distance from said first edge;
  an outer row of bondfingers positioned at a sixth distance from said first edge that is greater than said fifth distance; and
 a plurality of wires for electrically connecting said conductive connectors to said bondfingers.

4. The device of claim 3, wherein said plurality of wires further comprise:
 a plurality of first wires having a first wire loop height, connecting one or more of the conductive connectors in said outer row of conductive connectors to unique ones of the bondfingers in said inner row of bondfingers; and a plurality of second wires having a second wire loop height greater than said first wire loop height, connecting one or more of the conductive connectors in said inner row of conductive connectors to unique ones of the bondfingers in said outer row of bondfingers.

5. The device of claim 1, wherein said outer row of conductive connectors includes twice as many connectors as said inner row.

6. The device of claim 1, wherein said outer row of conductive connectors includes three times as many connectors as said inner row.

7. The device of claim 1, wherein said outer row of conductive connectors includes four times as many connectors as said inner row.

8. A semiconductor package comprising:

a semiconductor die including:
  a first surface and first edge;
  an outer row of conductive pad connectors positioned on said first surface substantially parallel to said first edge at a first distance from said first edge; and
  an inner row of conductive pad connectors positioned on said first surface substantially parallel to said first edge at a second distance from said first edge that is greater than the first distance;
  wherein said outer row of conductive pad connectors comprises a greater number of conductive pad connectors than said inner row;

a package substrate having an inner row of bondfingers positioned at a third distance from said first edge;

a plurality of wires connecting one or more of said conductive pad connectors to unique ones of the bondfingers, a plurality of conducting traces adjacent one another and separated one from the other by a third distance, said plurality of conducting traces disposed between and separated from connectors of the inner row by a fourth distance, each of said traces being connected to a unique one of said connectors in said outer row, and the conductive connectors of the inner and outer rows staggered such that adjacent conductive connectors of the inner row are separated by at least two of the plurality of conducting traces.

9. The package of claim 8, wherein said package substrate further comprises:

an outer row of bondfingers positioned at a fourth distance from said first edge that is greater than said third distance;

wherein said plurality of wires further comprise:
  a plurality of first wires having a first wire loop height, connecting one or more of the conductive pad connectors in said outer row of conductive pad connectors to unique ones of the bondfingers in said inner row of bondfingers; and
  a plurality of second wires having a second wire loop height greater than said first wire loop height, connecting one or more of the conductive pad connectors in said inner row of conductive pad connectors to unique ones of the bondfingers in said outer row of bondfingers.

10. A method of bonding a semiconductor die to a package substrate, said method comprising the steps of:

providing an outer row of conductive pad connectors disposed in said die and positioned substantially parallel to, and at a first distance from, a first edge of said die;

providing an inner row of conductive pad connectors disposed in said die and positioned substantially parallel to, and at a second distance from, the first edge of said die, said inner row containing fewer conductive pad connectors than said outer row, said second distance being greater than said first distance;

providing a plurality of conducting traces adjacent one another and separated one from the other by a third distance, said plurality of conducting traces disposed between and separated from connectors of the inner row by a fourth distance, each of said traces being connected to a unique one of said connectors in said outer row;

staggering the conductive connectors of the inner and outer rows such that adjacent conductive connectors of the inner row are separated by at least two of the plurality of conducting traces;

providing an inner row of bondfingers on said package substrate at a third distance from the first edge; and connecting one or more of the conductive pad connectors to unique ones of the bondfingers.

11. The method of claim 10, further comprising the step of staggering the conductive pad connectors in said inner row of conductive pad connectors in relation to the conductive pad connectors in said outer row of conductive pad connectors so that said outer row of conductive pad connectors contains at least twice as many conductive pad connectors as said outer row of conductive pad connectors.

12. The method of claim 10, further comprising the steps of:

providing an outer row of bondfingers on said package substrate at a fourth distance from said first edge that is greater than the third distance;

said step of connecting further comprising the steps of:
  connecting one or more of the conductive pad connectors in the outer row of conductive pad connectors to unique ones of the bondfingers in the inner row of bondfingers with wires having a first wire loop height; and
  connecting one or more of the conductive pad connectors in the inner row of conductive pad connectors to unique ones of the bondfingers in the outer row of bondfingers with wires having a second wire loop height greater than the first wire loop height.

13. A device manufactured in accordance with the method of claim 10.

* * * * *